United States Patent
Mun (10) Patent No.: US 8,482,002 B2
(45) Date of Patent: Jul. 9, 2013

(54) SEMICONDUCTOR DEVICE INCLUDING BONDING PADS AND SEMICONDUCTOR PACKAGE INCLUDING THE SEMICONDUCTOR DEVICE

(75) Inventor: Chear-yeon Mun, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 797 days.

(21) Appl. No.: 12/591,203

(22) Filed: Nov. 12, 2009

(65) Prior Publication Data

US 2010/0181567 A1    Jul. 22, 2010

(30) Foreign Application Priority Data

Jan. 20, 2009    (KR) .................. 10-2009-0004574

(51) Int. Cl.
*H01L 23/58*    (2006.01)

(52) U.S. Cl.
USPC .......................................... 257/48; 257/784

(58) Field of Classification Search
USPC ............................................. 257/48, 784, 690
See application file for complete search history.

(56) References Cited

U.S. PATENT DOCUMENTS

| 6,844,631 B2 | 1/2005 | Yong et al. | |
| 6,897,669 B2 * | 5/2005 | Ishio et al. | 257/48 |

FOREIGN PATENT DOCUMENTS

| JP | 6-260528 | 9/1994 |
| KR | 10-727490 | 6/2007 |

* cited by examiner

*Primary Examiner* — Mark Prenty
(74) *Attorney, Agent, or Firm* — Harness, Dickey & Pierce, P.L.C.

(57) ABSTRACT

Provided is a semiconductor device that may prevent a test pad planned not to be wire bonded from being wire bonded. The semiconductor device may include a bonding pad planned to be wire bonded and a test pad planned not to be wire bonded, and a passivation layer including a first opening portion exposing part of the bonding pad and a second opening portion exposing part of the test pad, wherein the diameter of the first opening portion is greater than the diameter of a tip of a bonding wire, and the diameter of the second opening portion is less than the diameter of the tip of the bonding wire.

20 Claims, 8 Drawing Sheets

SEMICONDUCTOR DEVICE INCLUDING BONDING PADS AND SEMICONDUCTOR PACKAGE INCLUDING THE SEMICONDUCTOR DEVICE

CROSS-REFERENCE TO RELATED APPLICATIONS

This application claims priority under 35 U.S.C. §119 to Korean Patent Application No. 10-2009-0004574, filed on Jan. 20, 2009, in the Korean Intellectual Property Office (KIPO), the entire contents of which are herein incorporated by reference.

BACKGROUND

1. Field

The inventive concept relates to a semiconductor device, and more particularly, to a semiconductor device including bonding pads for wire bonding and test pads for probe testing only and a method of fabricating the semiconductor device.

2. Description of the Related Art

A pad area of a conventional semiconductor chip includes test pads and bonding pads. Bonding pads of a semiconductor chip are terminals through which a signal is input and output and through which the semiconductor chip is coupled to an external power supply. The bonding pads, unlike the test pads, may be wire bonded to a package substrate. After the semiconductor chip is fabricated, some of the bonding pads are tested using a test probe to check the electrical properties of the semiconductor chip. The test pads are also planned to be tested using a test probe but are not planned to be wire bonded. However, the test pads may be wire bonded due to an error.

Figure 1A:
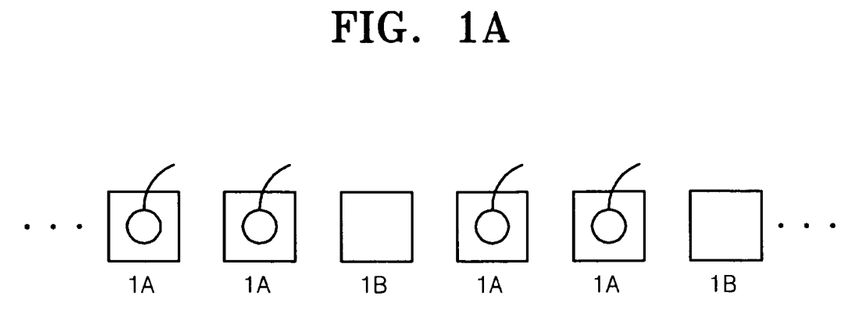
FIG. 1A illustrates correct wire bonding in a pad area where all the bonding pads are wire bonded and none of the test pads are wire bonded.
Figure 1B:
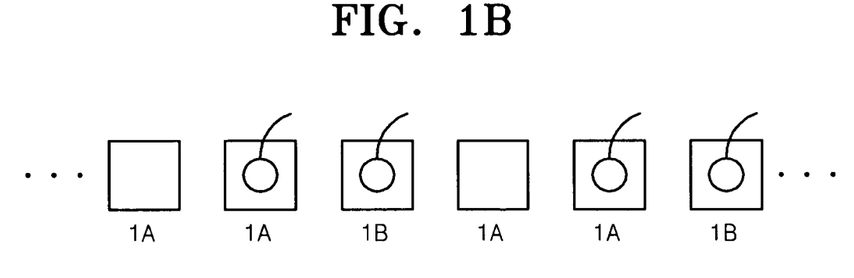
FIG. 1B illustrates incorrect wire bonding in the pad area where some of the bonding pads are not wire bonded and some of the test pads are wire bonded.

FIG. 1A illustrates correct wire bonding in the pad area. As shown in FIG. 1A, only the bonding pads 1A are wire bonded, that is, none of the test pads 1B are wire bonded. FIG. 1B illustrates an incorrect wire bonding in the pad area. As shown in FIG. 1B, some of the bonding pads 1A are not wire bonded and some of the test pads 1B are wire bonded.

Referring to FIG. 1A, the bonding pads 1A planned to be wire bonded are all wire bonded, and the test pads 1B planned not to be wire bonded are not wire bonded. Referring to FIG. 1B, some of the bonding pads 1A planned to be wire bonded are not wire bonded, and some of the test pads 1B planned not to be wire bonded are wire bonded.

Whether wire bonding is performed with reliability may be determined by measuring the resistances of the bonding pads 1A that are wire bonded. However, since the resistances of the test pads 1B which are wire bonded in error are also measured, it is difficult to determine whether wire bonding is performed on the right pad, i.e. on the bonding pad 1A.

SUMMARY

The inventive concept provides a semiconductor device, including bonding pads and test pads. The inventive concept may prevent test pads planned not to be wire bonded from being wire bonded due to an error. The inventive concept also provides for a semiconductor package including the semiconductor device.

In accordance with an example embodiment, a semiconductor device may include a bonding pad and a test pad over a substrate, and a passivation layer over the bonding pad and the test pad, wherein the passivation layer includes a first opening portion exposing the bonding pad and a second opening portion exposing the test pad. In accordance with this example embodiment, a diameter of the first opening portion may be greater than a diameter of a tip of a bonding wire for wirebonding the bonding pad, and a diameter at least a part of of the second opening portion may be less than the diameter of the tip of the bonding wire.

In accordance with another example embodiment, a semiconductor package may include a semiconductor chip including a bonding pad and a test pad over a semiconductor substrate, a passivation layer including a first opening portion exposing part of the bonding pad and a second opening portion exposing part of the test pad, and a protective layer over the passivation layer, wherein a diameter of the first opening portion is greater than a diameter of a tip of a bonding wire for wirebonding the bonding pad and a diameter of at least a part of the second opening portion is less than the diameter of the tip of the bonding wire. In accordance with this example embodiment, the semiconductor package may further include a package substrate on which the semiconductor chip is mounted and to which the bonding pad of the semiconductor chip is wire bonded and a sealing resin sealing the semiconductor chip mounted on the package substrate.

According to an example embodiment, a semiconductor device may include a bonding pad planned to be wire bonded, a test pad planned not to be wire bonded, and a passivation layer including a first opening portion exposing part of the bonding pad and a second opening portion exposing part of the test pad. In accordance with this example embodiment, the diameter of the first opening portion may be greater than the diameter of a tip of a bonding wire, and the diameter of the second opening portion may be less than the diameter of the tip of the bonding wire.

The semiconductor device may further include a protective layer disposed on the passivation layer, wherein the first opening portion and the second opening portion are also formed in the protective layer.

A sidewall of the passivation layer and a sidewall of the protective layer in the first opening portion and the second opening portion may be connected to each other. A part of a top surface of the passivation layer in the first opening portion and the second opening portion may be exposed.

The second opening portion may have a diameter that allows the semiconductor device to be probed by a test probe.

The bonding pad and the test pad may be arranged in the middle of the semiconductor device. The bonding pad and the test pad may be arranged along edges of the semiconductor device.

According to a second example embodiment, a semiconductor package may include a semiconductor chip including a bonding pad planned to be wire bonded and a test pad planned not to be wire bonded. The bonding pad and the test pad may be disposed on part of a semiconductor substrate. The semiconductor package according to this example embodiment may further include a passivation layer including a first opening portion exposing part of the bonding pad and a second opening portion exposing part of the test pad. The semiconductor package according to this example embodiment may further include a protective layer disposed on the passivation layer, wherein the diameter of the first opening portion is greater than the diameter of a tip of a bonding wire and the diameter of the second opening portion is less than the diameter of the tip of the bonding wire. The semiconductor package according to this example embodiment may further include a package substrate on which the semiconductor chip is mounted and to which the bonding pad of the semiconductor chip is wire bonded, and a sealing resin sealing the semiconductor chip mounted on the package substrate.

The package substrate may include a printed circuit board (PCB) or a flexible film.

The semiconductor package may further include external connection terminals for connection with an external circuit.

BRIEF DESCRIPTION OF THE DRAWINGS

Example embodiments will be more clearly understood from the following detailed description taken in conjunction with the accompanying drawings in which.

DETAILED DESCRIPTION OF THE EXAMPLE EMBODIMENTS

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 2A:
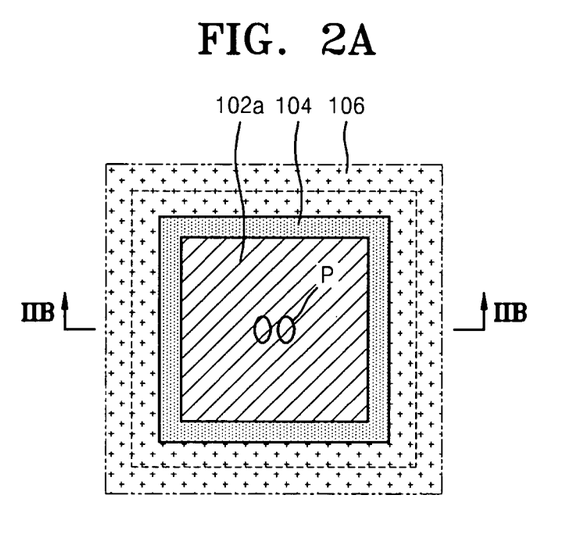
FIGS. 2A and 2B are respectively a top view and a cross-sectional view of a bonding pad planned to be wire bonded in a semiconductor device, according to a first example embodiment.
Figure 2B:
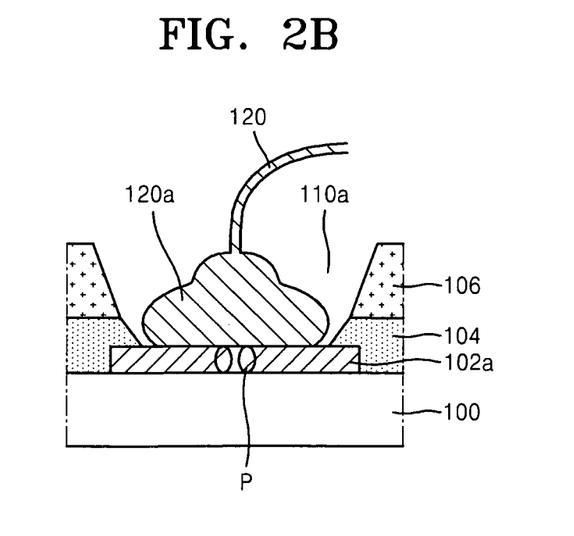
Figure 3A:
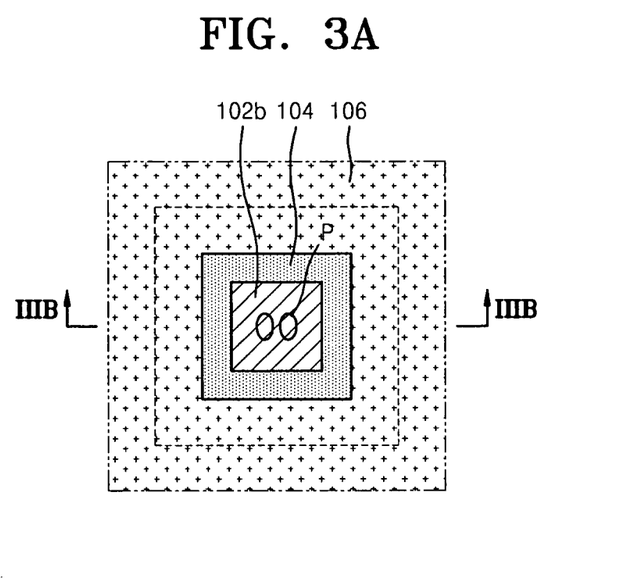
FIGS. 3A and 3B are respectively a top view and a cross-sectional view of a test pad planned not to be wire bonded in the semiconductor device of FIGS. 2A and 2B, according to the first example embodiment.
Figure 3B:
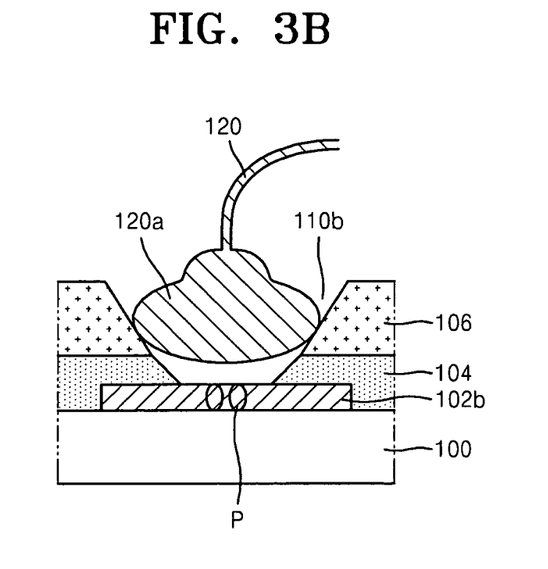

FIGS. 2A, 2B, 3A, and 3B illustrate a bonding pad 102a and a test pad 102b of a semiconductor chip, according to a first example embodiment. FIG. 2A illustrates a top view of the bonding pad 102a and FIG. 2B is a cross-sectional view taken along line IIB-IIB of FIG. 2A. FIG. 3A illustrates a top view of the test pad 102b and FIG. 3B is a cross-sectional view taken along line IIIB-IIIB of FIG. 3A. In this example embodiment, the bonding pad 102a is planned to be wire bonded and the test pad 102b is planned to not be wire bonded. FIGS. 2B and 3B each illustrate a bonding wire 120 located over the bonding pad 102a and the test pad 102b of FIGS. 2A and 3A, respectively.

Referring to FIGS. 2A, 2B, 3A, and 3B, the bonding pad 102a and the test pad 102b are formed on a semiconductor substrate 100. Various semiconductor devices may be formed in the semiconductor substrate 100. The bonding pad 102a and test pad 102b may be electrically connected to a metal layer (not shown) that is part of the semiconductor device. The bonding pad 102a and the test pad 102b may be formed of aluminium, or a conductive material other than aluminium. The bonding pad 102a and test pad 102b may have a single-layer structure or a multi-layer structure.

The bonding pad 102a may be exposed through a passivation layer 104 and a protective layer 106 via an opening portion 110a. Similarly, the test pad 102b may likewise be exposed through a passivation layer 104 and a protective layer 106 via an opening portion 110b. The passivation layer 104 may be a silicon oxide layer, a silicon nitride layer, or a composite structure thereof. The protective layer 106 may be formed of photosensitive polyimide (PSPI). The protective layer 106 may reduce or minimize an impact on the semiconductor chip and may prevent or minimize a defect such as a scratch.

The openings 110a and 110b, as shown in FIGS. 2B and 3B, respectively, may be formed such that they are rectangular in plan view, however, example embodiments are not limited thereto. For example, the openings 110a and 110b may formed to be circular or polygon-shaped in plan view. Furthermore, as shown in FIGS. 2B and 3B, the cross-sectional areas of the openings 110a and 110b may decrease as the cross-sectional areas approach the bonding pad 102a and the test pad 102b. Although FIGS. 2B and 3B illustrate that the cross-sectional areas of the openings 110a and 110b may decrease as the areas approach the bonding pad 102a and test pad 102b, example embodiments are not limited thereto. For example, the openings 110a and 110b may have a constant cross-sectional area throughout the depth of the openings 110a and 110b.

In FIGS. 2A through 3B, a sidewall of the passivation layer 104 and a sidewall of the protective layer 106, which are exposed by the opening portions 110a and 110b, are continuously connected to each other with no stepped portion. Although there is no stepped portion between the passivation layer 104a and the protective layer 106 in the opening portions 110a and 110b, the inclination of the sidewall of the passivation layer 104 and the inclination of the sidewall of the protective layer 106 may be different from each other.

As shown in FIGS. 2A and 2B, the opening portion 110a exposing part of the bonding pad 102a planned to be wire bonded has a diameter greater than the diameter of a tip 120a of the bonding wire 120 so that the tip 120a of the bonding wire 120 may contact the bonding pad 102a.

As shown in FIGS. 3A and 3B, the opening portion 110b exposing part of the test pad 102b has a diameter greater than the size of a test probe and less than the diameter of a tip 120a of the bonding wire 120.

The size of the test probe is less than the diameter of the tip 120a of the bonding wire 120. Two oval points P respectively of the bonding pad 102a and the test pad 102b in FIGS. 2A, 2B, 3A, and 3B are contact points of the test probe. Even if the tip 120a of the bonding wire 120 is wrongly positioned in the opening portion 110b, since the diameter of the opening portion 110b near the test pad 102b is less than the diameter of the tip 120a of the bonding wire 120, the tip 120a of the bonding wire 120 is prevented from contacting the test pad 102b. For example, in the event a bonding wire 120 is placed in the opening portion 110b, the tip 120a of the bonding wire 120 may only be placed in the opening portion 110b above the test pad 102b or placed on a top surface of the protective layer 106, and thus does not contact the test pad 102b.

If the sidewall of the protective layer 106 is patterned to be inclined as shown in FIG. 3B, the tip 120a of the bonding wire 120 may be placed in the opening portion 110b above the test pad 102b. However, because the diameter of the opening portion 110b near the test pad is smaller than a diameter of the tip 120a of the bonding wire 120, the tip 120a of the bonding wire 120a is prevented from contacting the test pad 102b. If the protective layer 106 is vertically patterned, the tip 120a of the bonding wire 120 is placed on the top surface of the protective layer 106.

As described above, the opening portion 110a of the passivation layer 104 and the protective layer 106 exposing part of the bonding pad 102a has a diameter greater than the diameter of the tip 120a of the bonding wire 120, and the opening portion 110b of the passivation layer 104 and the protective layer 106 exposing part of the test pad 102b has a diameter less than the diameter of the tip 120a of the bonding wire 120. Accordingly, even if the tip 120a of the bonding wire 120 is positioned over the test pad 102b, since the diameter of the opening portion 110b exposing part of the test pad 102b is less than the diameter of the tip 120a of the bonding wire 120, the tip 120a of the bonding wire 120 is placed in the opening portion 110b to be above the test pad 102b or placed on the top surface of the protective layer 106, and thus does not contact the test pad 102b. Accordingly, the test pad 102b may be prevented from being wire bonded.

Although FIGS. 2A and 2B illustrate an example embodiment having a single bonding pad 102a on a semiconductor substrate 100, example embodiments are not limited thereto. For example, the semiconductor substrate 100 may have a plurality of bonding pads each of which are similar or identical to the bonding 102a. Similarly, although FIGS. 3A and 3B illustrate an example embodiment having a single test pad 102b on a semiconductor substrate 100, example embodiments are not limited thereto. For example, the semiconductor substrate 100 may have a plurality of test pads each of which are similar or identical to the test pad 102b.

Figure 4A:
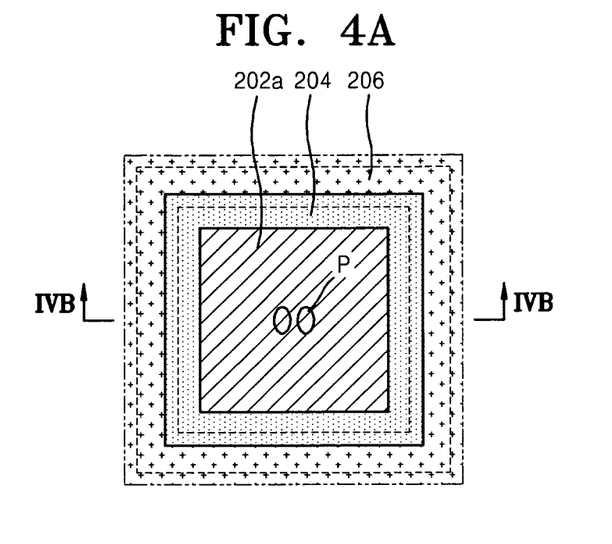
FIGS. 4A and 4B are respectively a top view and a cross-sectional view of a bonding pad planned to be wire bonded in a semiconductor device, according to a second example embodiment.
Figure 4B:
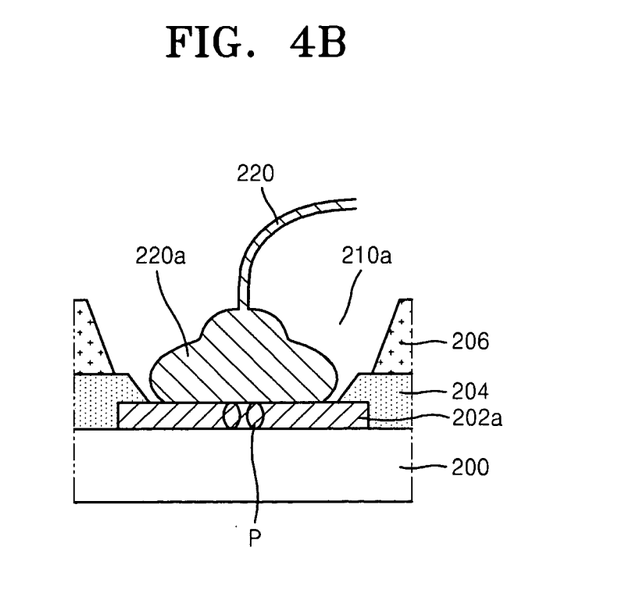
Figure 5A:
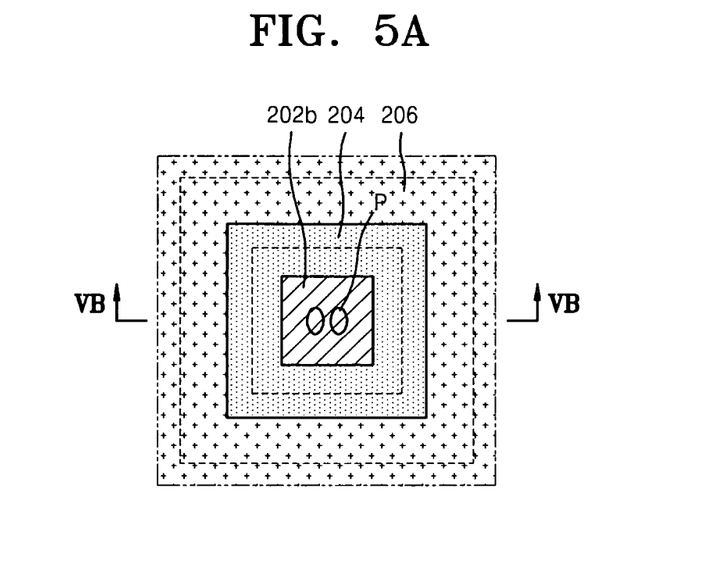
FIGS. 5A and 5B are respectively a top view and a cross-sectional view of a test pad planned not to be wire bonded in the semiconductor device of FIGS. 4A and 4B, according to the second example embodiment.
Figure 5B:
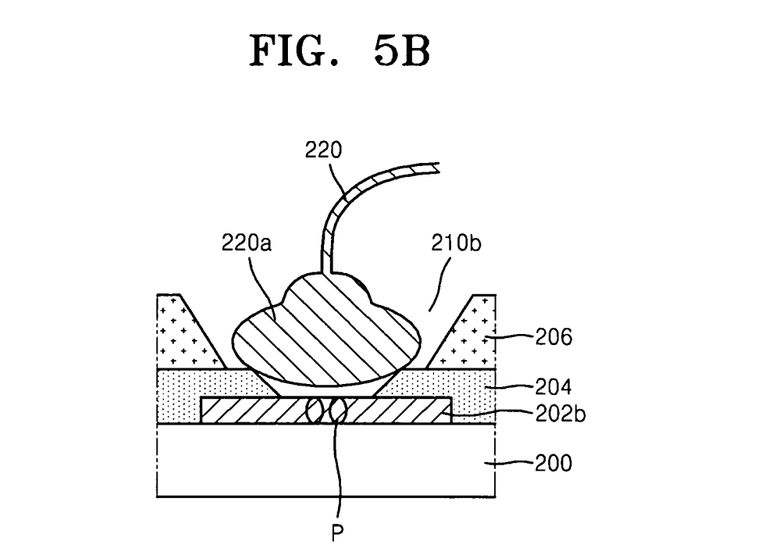

FIGS. 4A, 4B, 5A, and 5b illustrates a bonding pad 202a and a test pad 202b of a semiconductor chip, according to a second example embodiment. In this example embodiment, the bonding pad 202a of the semiconductor chip is planned to be wired bonded and the test pad 202b is not planned to be wire bonded. FIG. 4A is a top view of the bonding pad 202a and FIG. 4B is a cross-sectional view taken along line IVB-IVB of FIG. 4A. FIG. 5A is a top view of the test pad 202b and FIG. 5B is a cross-sectional view taken along line VB-VB of FIG. 5A. FIGS. 4B and 5B illustrate bonding wires 220 located over the bonding pad 202a and the test pad 202b of FIGS. 4A and 5A, respectively.

The embodiments of FIGS. 4A, 4B, 5A, and 5B are different from the embodiments of FIGS. 2A, 2B, 3A, and 3B in that there is a stepped portion between a sidewall of a protective layer 206 and a sidewall of a passivation layer 204 in each of the opening portions 210a and 210b.

Referring to FIGS. 4A, 4B, 5A, and 5B, the bonding pad 202a and the test pad 202b are formed on a semiconductor substrate 200. Various semiconductor devices may be formed in the semiconductor substrate 200. The bonding pad 202a and the test pad 202b may be electrically connected to a metal layer (not shown). The bonding pad 202a and the test pad 202b may be formed of aluminium, or a conductive material other than aluminium. The bonding pad 202a and the test pad 202b may have a single-layer structure or a multi-layer structure.

The passivation layer 204 and the protective layer 206 having the opening portions 210a and 210b that respectively expose parts of the bonding pad 202a and the test pad 202b are formed on the semiconductor substrate 200. The passivation layer 204 may be a silicon oxide layer, a silicon nitride layer, or a composite structure thereof The protective layer 206 may be formed of PSPI. The protective layer 206 may reduce or minimize impact on the semiconductor chip and prevent or minimize a defect such as a scratch.

The opening portion 210a exposing part of the bonding pad 202a has a diameter greater than a diameter of a tip 220a of the bonding wire 220 so that the tip 220a of the bonding wire 220 may contact the bonding pad 202a. The opening portion 210b exposing part of the test pad 202b has a diameter much greater than the size of the test probe and less than the diameter of the tip 220a of the bonding wire 220.

As shown in FIGS. 4B and 5B, since the opening portions 210a and 210b of the protective layer 206 are greater than the opening portions 210a and 210b of the passivation layer 204, a stepped portion is formed between the sidewall of the protective layer 206 and the sidewall of the passivation layer 204 in the opening portions 210a and 210b. That is, the opening portions 210a and 210b of the protective layer 206 expose a part of a top surface of the passivation layer 204.

Even if a tip 220a of the bonding wire 220 is wrongly positioned in the opening portion 210b, since the diameter of the opening portion 210b near the test pad 202b is less than the diameter of the tip 220a of the bonding wire 220, the tip 220a of the bonding wire 220 is prevented from contacting the test pad 202b. In other words, in the event a tip 220a of a bonding wire 220 is placed in the opening portion 210b, the top 220a of the bonding wire 220 will be placed on the top surface of the passivation layer 206, and thus does not contact the test pad 202b. The tip 220a of the bonding wire 220 may be placed on the part of the top surface of the passivation layer 204 in the opening portion 210b as shown in FIG. 5B, or may be placed in the opening portion 210b of the protective layer 206 to be above the test pad 202b.

Although FIGS. 4A and 4B illustrate an example embodiment having a single bonding pad 202a on a semiconductor substrate 200, example embodiments are not limited thereto. For example, the semiconductor substrate 200 may have a plurality of bonding pads each of which are similar or identical to the bonding 202a. Similarly, although FIGS. 5A and 5B illustrate an example embodiment having a single test pad 202b on a semiconductor substrate 200, example embodiments are not limited thereto. For example, the semiconductor substrate 200 may have a plurality of test pads each of which are similar or identical to the test pad 202b.

FIGS. 6A through 6D are cross-sectional views illustrating a method of fabricating the semiconductor device including the bonding pad 102a and the test pad 102b of FIGS. 2A through 3B, according to an example embodiment.

Figure 6A:
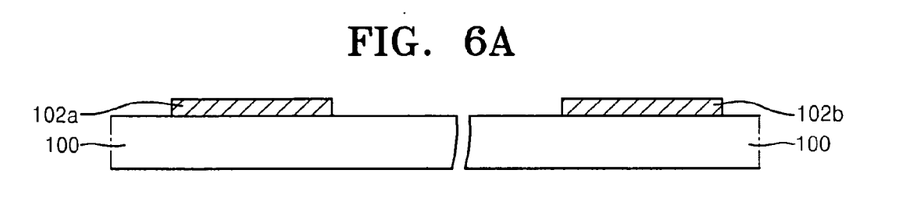
FIGS. 6A through 6D are cross-sectional views illustrating a first example method of fabricating the semiconductor device including the bonding pad of FIGS. 2A and 2B and the test pad of FIGS. 3A and 3B, according to an example embodiment.

Referring to FIG. 6A, a bonding pad 102a and a test pad 102b are formed on the semiconductor substrate 100 in which semiconductor devices (not shown) are formed. The bonding pad 102a is planned to be wire bonded, and the test pad 102b is planned not to be wire bonded.

The bonding pad 102a and the test pad 102b may be electrically connected to a metal layer (not shown) that is part of the semiconductor devices. The bonding pad 102a and the test pad 102b may be formed of aluminium, or a conductive material other than aluminium. The bonding pad 102a and the test pad 102b may have a single-layer structure or a multi-layer structure. Optionally, a diffusion barrier layer may be formed under the bonding pad 102a and the test pad 102b.

Figure 6B:
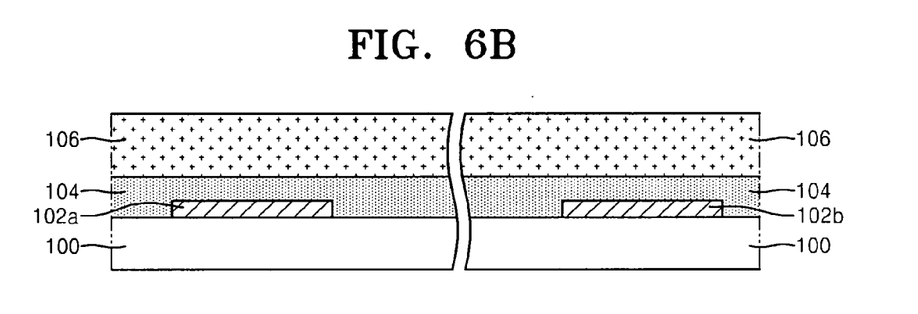

Referring to FIG. 6B, the passivation layer 104 and the protective layer 106 are sequentially formed on the semiconductor substrate 100 on which the bonding pad 102a and the test pad 102b are formed. The passivation layer 104 may be a silicon oxide layer, a silicon nitride layer, or a composite structure thereof. The protective layer 106 may be formed of PSPI. The protective layer 106 has elasticity high enough to reduce or minimize an impact on a semiconductor chip and prevent or minimize a defect such as a scratch.

Figure 6C:
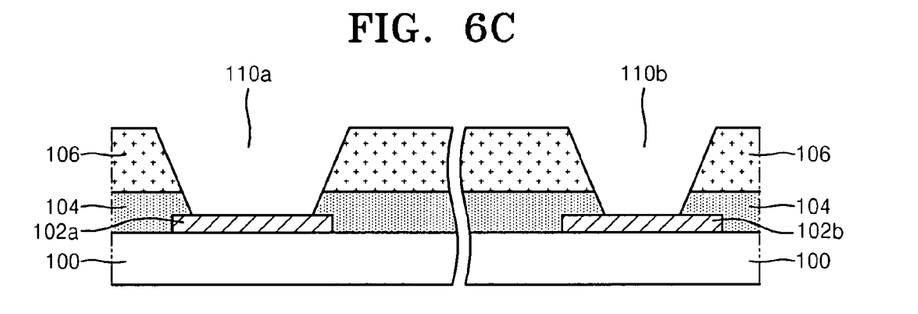

Referring to FIG. 6C, the protective layer 106 and the passivation layer 104 are etched to expose parts of the bonding pad 102a and the test pad 102b. The etching may be performed by providing a photoresist pattern (not shown) on the protective layer 106. Then, the photoresist pattern, the protective layer 106, and the passivation layer 104 are simultaneously etched using the photoresist pattern as an etch mask to form the opening portions 110a and 110b respectively exposing parts of the bonding pad 102a and the test pad 102b.

The opening portion 110a exposing part of the bonding pad 102a (which is planned to be wire bonded) has a diameter greater than a diameter of the tip 120a of a bonding wire 120 (see FIG. 6D) so that a tip 120a of the bonding wire 120 may contact the bonding pad 102a.

The opening portion 110b exposing part of the test pad 102b (planned to be tested using a test probe and planned not to be wire bonded) has a diameter greater than the size of the test probe and less than the diameter of the tip 120a of the bonding wire 120. Two oval points P respectively of the bonding pad 102a and the test pad 102b of FIGS. 2A, 2B, 3A, and 3B are contact points of the test probe. The test probe has a size less than the diameter of the tip 120a of the bonding wire 120.

Figure 6D:
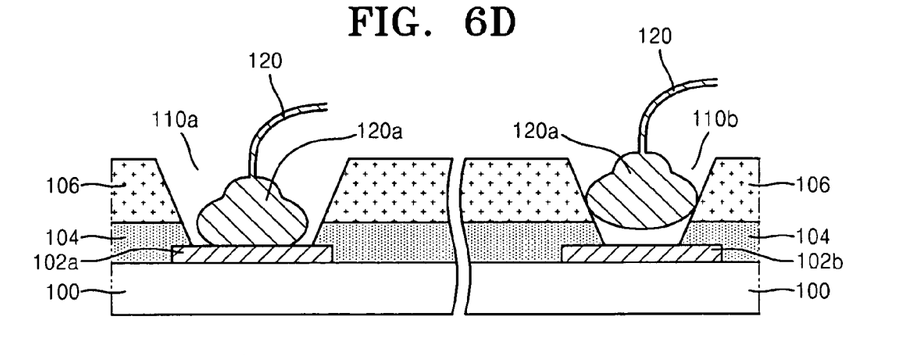

FIG. 6D illustrates a state where the tip 120a of the bonding wire 120 is placed over the bonding pad 102a and the test pad 102b. Since the opening portion 110a exposing part of the bonding pad 102a has a diameter greater than the diameter of the tip 120a of the bonding wire 120, the tip 120a of the bonding wire 120 contacts the bonding pad 102a. However, since the opening portion 110b exposing part of the test pad 102b has a diameter smaller than the diameter of the tip 120a of the bonding wire 120, the tip 120a of the bonding wire 120 placed in the opening portion 110b is prevented from contacting the test pad 102b.

Although this example embodiment illustrates an example method of fabricating the semiconductor device including the bonding pad 102a and the test pad 102b of FIGS. 2A through 3B, example embodiments are not limited to a method of forming a single bonding pad 102a and a single test pad 102b. For example, the example method provided above could be used to manufacture a semiconductor device having multiple bonding pads, wherein some or all of the bonding pads are similar to or identical the bonding pad 102a. Additionally, the example method provided above could be used to manufacture a semiconductor device having multiple test pads, wherein some or all of the test pads are similar to or identical the test pad 102b.

FIGS. 7A through 7D are cross-sectional views illustrating a method of fabricating the semiconductor device including the bonding pad 202a and the test pad 202b of FIGS. 4A through 5B, according to another example embodiment. The bonding pad 202a is a pad which is planned to be wire bonded and the test pad 202b is a pad which is not planned to be wire bonded. The method of FIGS. 7A through 7D is different from the method of FIGS. 6A through 6D in a process of forming the protective layer 206.

Figure 7A:
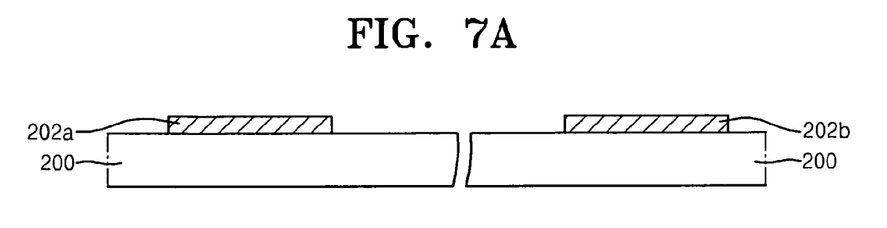
FIGS. 7A through 7D are cross-sectional views illustrating a second method of fabricating the semiconductor device including the bonding pad of FIGS. 4A and 4B and the test pad of FIGS. 5A and 5B, according to another example embodiment.

A process of forming the bonding pad 202a and the test pad 202b of FIG. 7A is the same as the process of forming the bonding pad 102a and the test pad 102b of FIG. 6A, and thus a detailed explanation thereof will not be given.

Figure 7B:
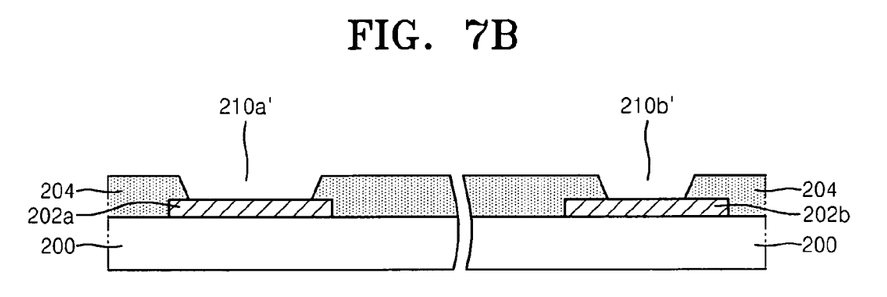

Referring to FIG. 7B, the passivation layer 204 is formed on the semiconductor substrate 200 on which the bonding pad 202a and the test pad 202b are formed. The passivation layer 204 may be a silicon oxide layer, a silicon nitride layer, or a composite structure thereof. The passivation layer 204 is patterned to form opening portions 210a' and 210b' using photolithography.

The opening portion 210a' for exposing part of the bonding pad 202a planned to be wire bonded has a diameter greater than a diameter of a tip 220a of the bonding wire 220. The opening portion 210b' for exposing part of the test pad 202b planned not to be wire bonded has a diameter less than the diameter of the tip 220a of the bonding wire 220.

Figure 7C:
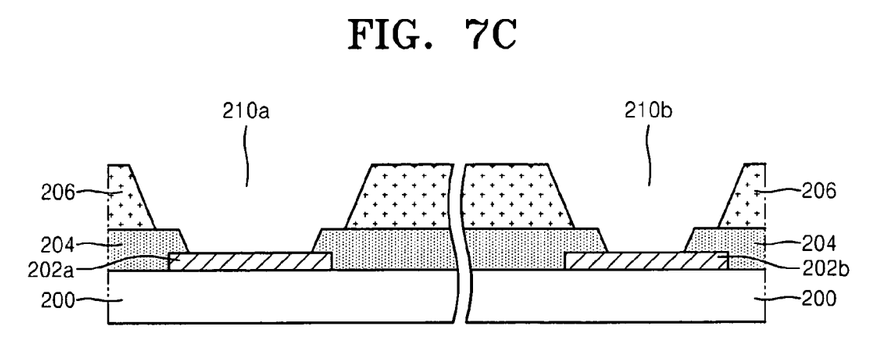

Referring to FIG. 7C, the protective layer 206 is formed on the passivation layer 204, and the protective layer 206 is patterned to completely form the opening portions 210a and 210b. If the protective layer 206 is formed of PSPI, the protective layer 206 may be patterned using lithography.

The lithography includes a baking process of baking PSPI. The protective layer 206 and the passivation layer 204 may be patterned so that portions of the opening portions 210a and 210b in the protective layer 206 are greater in diameter than portions of the opening portions 210a and 210b in the passivation layer 204. Accordingly, a sidewall of the passivation layer 204 and a sidewall of the protective layer 206 are not continuously connected to each other and a stepped portion is formed between the passivation layer 204 and the protective layer 206.

The portion of the opening portion 210b in the protective layer 206, which is above the test pad 202b may have a diameter greater than the diameter of the tip 220a of the bonding wire 220, or less than the diameter of the tip 220a of the bonding wire 220.

Figure 7D:
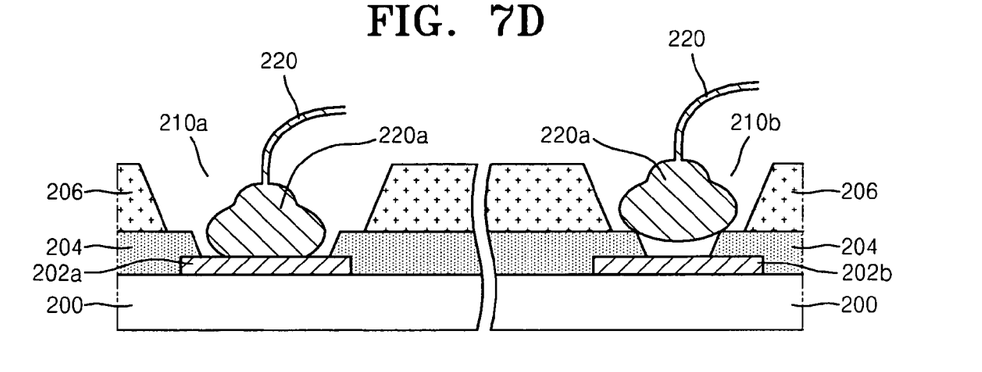

FIG. 7D illustrates a state where the tip 220a of the bonding wire 220 is placed over the bonding pad 202a and the test pad 202b. Since the opening portion 210a exposing part of the bonding pad 202a planned to be wire bonded has a diameter greater than the diameter of the tip 220a of the bonding wire 220, the tip 220a of the bonding wire 220 contacts the bonding pad 202a.

If the portion of the opening portion 210b in the protective layer 206, which is above the test pad 202b, has a diameter greater than the diameter of the tip 220a of the bonding wire 220, the tip 220a of the bonding wire 220 is placed on a top surface of the passivation layer 204 in the opening portion 210b, and thus does not contact the test pad 202b.

If the portion of the opening portion 210b in the protective layer 206, which is above the test pad 202b, has a diameter less than the diameter of the tip 220a of the bonding wire 220, the tip 220a of the bonding wire 220 will reside on a top surface of the protective layer 206 thus preventing the test pad 202b from being wire bonded. If the portion of the opening portion 210b in the protective layer 206, which is above the test pad 202b, has a diameter greater than the diameter of the tip 220a of the bonding wire 220, the tip 220a of the bonding wire 220 may reside in the opening portion 210b. However, because the portion of the opening portion 210b in the passivation layer 204 has a diameter smaller than the diameter of the tip 220a of the bonding wire 220, the tip 220a of the bonding wire 220 is prevented from contacting the test pad 202b by the passivation layer 204.

Although this example embodiment illustrates an example method of fabricating the semiconductor device including the bonding pad 202a and the test pad 202b of FIGS. 4A through 5B, example embodiments are not limited to a method of forming a single bonding pad 202a and a single test pad 202b. For example, the example method provided above could be used to manufacture a semiconductor device having multiple bonding pads, wherein some or all of the bonding pads are similar to or identical the bonding pad 202a. Additionally, the example method provided above could be used to manufacture a semiconductor device having multiple test pads, wherein some or all of the test pads are similar to or identical the test pad 202b.

Figure 8:
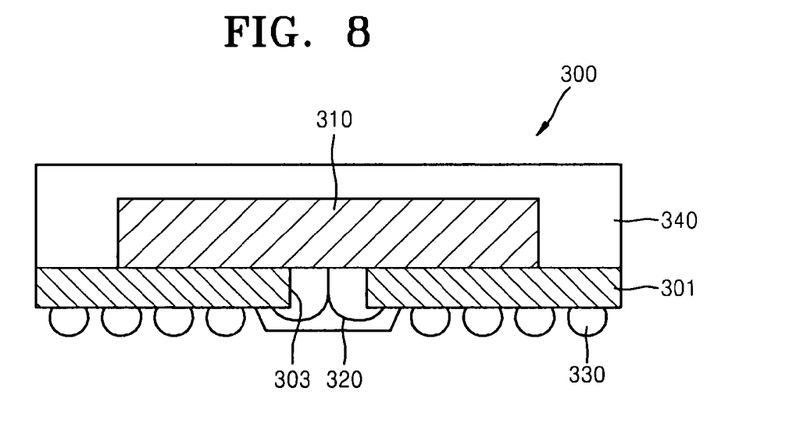
FIG. 8 is a cross-sectional view of a semiconductor package including a semiconductor chip, according to an example embodiment.
Figure 9:
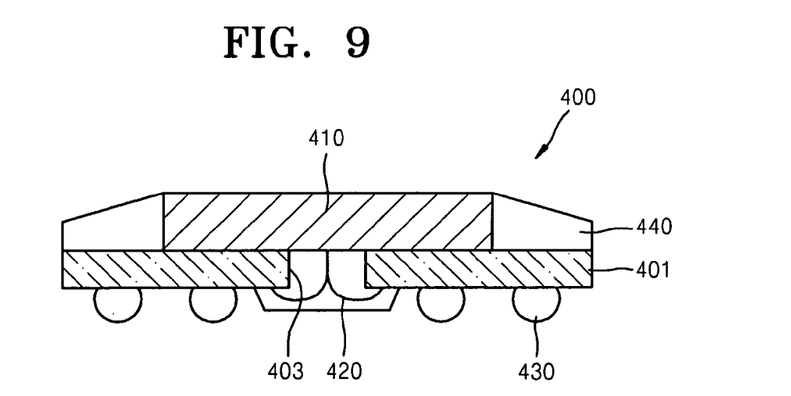
FIG. 9 is a cross-sectional view of a semiconductor package including a semiconductor chip, according to another example embodiment.

FIGS. 8 and 9 are cross-sectional views of semiconductor packages 300 and 400 including semiconductor chips 310 and 410, according to different example embodiments.

Referring to FIG. 8, the semiconductor chip 310 is mounted on part of a package substrate 301 and is wire bonded to the package substrate 301 using bonding wires 320. A sealing resin 340 is formed to seal the semiconductor chip 310 and the bonding wires 320.

The pad area including bonding pads and test pads (not shown) are arranged in the middle of the semiconductor chip 310. Through-holes (not shown) are formed in the package substrate 301, so that parts of the bonding pads are exposed through the through-holes. External connection terminals 330 for connection with an external circuit are formed on the package substrate 301.

Referring to FIG. 9, the semiconductor chip 410 is mounted on part of a package base film 401 and is wire bonded to the package base film 401 using bonding wires 420. The package base film 401 may be formed of flexible polyimide. A sealing resin 440 may be formed to seal the semiconductor chip 410 and the bonding wires 420. The pad area including bonding pads and test pads (not shown) are arranged in the middle of the semiconductor chip 410, and windows 403 are formed in the package base film 401, so that parts of the bonding pads are exposed through the windows 403. External connection terminals 430 for connection with an external circuit are formed on the package base film 401.

The pad area including bonding pads and test pads of the semiconductor chips 310 and 410 of the semiconductor packages 300 and 400 of FIGS. 8 and 9, respectively, are formed in the same manner as described above. That is, bonding pads planned to be wire bonded are partly exposed by opening portions each having a diameter greater than the diameter of a tip of a bonding wire, and test pads planned not to be wire bonded are partially exposed by opening portions each having a diameter less than the diameter of the tip of the bonding wire. The bonding pads of the semiconductor chips 310 and 410 are wire bonded to bonding pads (not shown) of the package substrate 301 and the package base film 401, respectively. If a test pad planned not to be wire bonded of the semiconductor chips 310 and 410 is wire bonded, the test pad is not sufficiently exposed by a respective opening portion, and thus does not contact a respective bonding wire.

Although the pad area including bonding pads and test pads are disposed in the middle of the semiconductor chips 310 and 410 in FIGS. 8 and 9, the pad area may be disposed in other locations. For example, the pad area may be formed along edges of the semiconductor chips 310 and 410.

If a test pad planned not to be wire bonded is wire bonded, since an electrical signal from the test pad is not measured in a test for determining whether wire bonding is normally performed, it is determined that the wire bonding is performed in the incorrect position, i.e. in the test pads.

While the inventive concept has been particularly shown and described with reference to example embodiments thereof, it will be understood that various changes in form and details may be made therein without departing from the spirit and scope of the following claims.

What is claimed is:

1. A semiconductor device comprising:
   a bonding pad and a test pad over a substrate;
   a passivation layer over the bonding pad and the test pad, the passivation layer including a first opening portion exposing the bonding pad and a second opening portion exposing the test pad, sidewalls of the passivation layer of the first and second opening portions being inclined;
      wherein a diameter of the first opening portion is greater than a diameter of a tip of a bonding wire for wirebonding the bonding pad, and a diameter of at least a part of the second opening portion is less than the diameter of the tip of the bonding wire.

2. The semiconductor device of claim 1, further comprising:

a protective layer over the passivation layer, wherein the first opening portion and the second opening portion are also in the protective layer.

3. The semiconductor device of claim 2, wherein a sidewall of the passivation layer and a sidewall of the protective layer in the first opening portion and the second opening portion are connected to each other.

4. The semiconductor device of claim 3, wherein the sidewalls of the passivation layer of the first and second opening portions are inclined differently from the sidewalls of the protective layer of the first and second opening portions.

5. The semiconductor device of claim 3, wherein the diameter of the second opening portion between a top surface of the passivation layer and a top surface of the protective layer is less than the diameter of the tip of the bonding wire.

6. The semiconductor device of claim 2, wherein a part of a top surface of the passivation layer in the first opening portion and the second opening portion is exposed.

7. The semiconductor device of claim 6, wherein the diameter of the second opening portion between the top surface of the passivation layer and a top surface of the protective layer is greater than the diameter of the tip of the bonding wire.

8. The semiconductor device of claim 7, wherein the diameter of the second opening portion between the top surface of the passivation layer and the substrate is less than the diameter of the tip of the bonding wire.

9. The semiconductor device of claim 1, wherein the diameter of the second opening portion is configured to allow the semiconductor device to be probed by a test probe.

10. The semiconductor device of claim 1, wherein the bonding pad and the test pad are arranged in a middle of the semiconductor device.

11. The semiconductor device of claim 1, wherein the bonding pad and the test pad are arranged along edges of the semiconductor device.

12. A semiconductor package comprising:
a semiconductor chip including,
a bonding pad and a test pad over a semiconductor substrate,
a passivation layer including a first opening portion exposing part of the bonding pad and a second opening portion exposing part of the test pad, and
a protective layer over the passivation layer, wherein a diameter of the first opening portion is greater than a diameter of a tip of a bonding wire for wirebonding the bonding pad and a diameter of at least a part of the second opening portion is less than the diameter of the tip of the bonding wire;
a package substrate on which the semiconductor chip is mounted and to which the bonding pad of the semiconductor chip is wire bonded; and
a sealing resin sealing the semiconductor chip mounted on the package substrate.

13. The semiconductor package of claim 12, wherein the package substrate is one of a printed circuit board (PCB) and a flexible film.

14. The semiconductor package of claim 12, further comprising:
at least one external connection terminal configured to connect to an external device.

15. The semiconductor device of claim 12, wherein a sidewall of the passivation layer and a sidewall of the protective layer in the first opening portion and the second opening portion are connected to each other.

16. The semiconductor device of claim 15, wherein the sidewalls of the passivation layer of the first and second opening portions is inclined differently from the sidewalls of the protective layer of the first and second opening portions.

17. The semiconductor device of claim 15, wherein the diameter of the second opening portion between a top surface of the passivation layer and a top surface of the protective layer is less than the diameter of the tip of the bonding wire.

18. The semiconductor device of claim 12, wherein a part of a top surface of the passivation layer in the first opening portion and the second opening portion is exposed.

19. The semiconductor device of claim 18, wherein the diameter of the second opening portion between the top surface of the passivation layer and a top surface of the protective layer is greater than the diameter of the tip of the bonding wire and the diameter of the second opening portion between the top surface of the passivation layer and the semiconductor substrate is less than the diameter of the tip of the bonding wire.

20. The semiconductor device of claim 12, wherein the diameter of the second opening portion is configured to allow the semiconductor device to be probed by a test probe.

* * * * *